(12) United States Patent
Karalkar et al.

(10) Patent No.: US 12,051,690 B2
(45) Date of Patent: Jul. 30, 2024

(54) SYMMETRIC BI-DIRECTIONAL SILICON-CONTROLLED RECTIFIER FOR ELECTROSTATIC DISCHARGE PROTECTION

(71) Applicant: GlobalFoundries U.S. Inc., Malta, NY (US)

(72) Inventors: Sagar Premnath Karalkar, Malden, MA (US); Prantik Mahajan, Dresden (DE); Jie Zeng, Singapore (SG); Ajay Ajay, Aligarh (IN); Milova Paul, Singapore (SG); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 478 days.

(21) Appl. No.: 17/523,956

(22) Filed: Nov. 11, 2021

(65) Prior Publication Data

US 2023/0141491 A1    May 11, 2023

(51) Int. Cl.
H01L 27/02 (2006.01)
(52) U.S. Cl.
CPC ................................ H01L 27/0262 (2013.01)
(58) Field of Classification Search
CPC .................................................. H01L 27/0262
See application file for complete search history.

(56) References Cited

U.S. PATENT DOCUMENTS

| | | |
|---|---|---|
| 6,045,567 A | 4/2000 | Taylor et al. |
| 6,838,707 B2 | 1/2005 | Chang |
| 7,915,638 B2 | 3/2011 | Tseng et al. |
| 9,018,072 B2 | 4/2015 | Gendron et al. |
| 9,177,952 B2 | 11/2015 | Zhan et al. |
| 9,478,608 B2 | 10/2016 | Salcedo et al. |
| 10,037,988 B1 | 7/2018 | Solaro et al. |

(Continued)

FOREIGN PATENT DOCUMENTS

CN    108520875 A  *  9/2018  ............ H01L 23/60

OTHER PUBLICATIONS

Gendron et al., "New High Voltage ESD Protection Devices Based on Bipolar Transistors for Automotive Applications," IEEE, 2011, pp. 1-10.

(Continued)

*Primary Examiner* — Peter M Albrecht
(74) *Attorney, Agent, or Firm* — Francois Pagette; Hoffman Warnick LLC

(57) ABSTRACT

Disclosed is a semiconductor structure including a semiconductor substrate (e.g., a P-substrate) and a symmetric BDSCR. The BDSCR includes, within the substrate, a first well (e.g., a low-doped deep Nwell) and, within the first well, symmetric side sections and a middle section positioned laterally between the side sections. Each side section includes: second and third wells (e.g., Pwells), where the third well is shallower than and has a higher conductivity level than the second well. Each middle section includes multiple floating wells including: two fourth wells (e.g., Nwells), which have a higher conductivity level than the first well, and a fifth well (e.g., another Pwell), which is positioned laterally between and shallower than the fourth wells. By incorporating the floating wells into the middle section, high current tolerance is improved.

20 Claims, 11 Drawing Sheets

(56) References Cited

U.S. PATENT DOCUMENTS 10,361,185 B2     7/2019    Zhan et al.
10,366,975 B1     8/2019    Wang et al.
11,011,509 B2     5/2021    Zeng et al.

OTHER PUBLICATIONS

Jung et al., "Design of SCR-Based ESD Protection Circuit for 3.3 V I/O and 20 V Power Clamp," ETRI Journal, vol. 37, No. 1, 2015, pp. 97-106.

Vashchenko et al., "Implementation of 60V Tolerant Dual Direction ESD Protection in 5V BiCMOS Process for Automotive Application," IEEE, 2009, pp. 1-8.

Vashchenko et al., "Multi-Port EDS Protection Using Bi-Directional SCR Structures," IEEE, 2003, pp. 137-140.

\* cited by examiner

SYMMETRIC BI-DIRECTIONAL SILICON-CONTROLLED RECTIFIER FOR ELECTROSTATIC DISCHARGE PROTECTION

BACKGROUND

Field of the Invention

The present invention relates to electrostatic discharge (ESD) protection devices and, more particularly, to embodiments of a symmetric bi-directional silicon-controlled rectifier (SCR) for electrostatic discharge (ESD) protection.

Description of Related Art

Fails due to electrostatic discharge (ESD) negatively impact the reliability of integrated circuits (ICs). IC designs typically include ESD protection devices (e.g., at input/output pads, at power pads and between power domains). Such ESD protection devices include, but are not limited to, diodes, transistors, and silicon-controlled rectifiers (SCRs). Recently, symmetric bi-directional silicon-controlled rectifiers (BDSCRs) have been developed for use as ESD protection devices. However, performance and, particularly, the high current carrying tolerance of these BDSCRs is limited. Techniques for overcoming this performance limitation include using a buried implant isolation region (e.g., an N-doped buried layer (NBL)) to lead the current deeper into the semiconductor substrate (which is undesirable because it increases processing complexity and, particularly, adds to the number of masks required during fabrication) and/or increasing the total width of BDSCRs (which is undesirable because it limits IC size scaling).

SUMMARY

In view of the foregoing, disclosed herein are embodiments of a semiconductor structure, which includes a symmetric bi-directional silicon-controlled rectifier (BDSCR) designed to have a high current carrying tolerance without increasing processing complexity or area consumption. Generally, each of the disclosed semiconductor structure embodiments can include a semiconductor substrate with a first type conductivity at a relatively low conductivity level. The semiconductor structure can further include a symmetric bi-directional silicon-controlled rectifier (BDSCR) on the substrate. The BDSCR can include a first well, which is within the substrate and which has a second type conductivity. The BDSCR can also include, within the first well, side sections (e.g., symmetric side sections) and a middle section positioned laterally between the side sections. Each side section can include a second well with the first type conductivity; and a third well, which is immediately adjacent to the second well and which has the first type conductivity at a higher conductivity level than the second well. The middle section can include multiple floating wells including: two floating fourth wells, which have the second type conductivity at a higher conductivity level than the first well; and a floating fifth well, which is positioned laterally between the fourth wells and which has the first type conductivity.

Differences in alternative embodiments disclosed herein can include, but are not limited to, differences in placement of the third well relative to the second well in each side section and differences in placement of contact regions relative to the second and third wells within each side section.

For example, one embodiment of the semiconductor structure disclosed herein can include a semiconductor substrate, which has first type conductivity at a relatively low conductivity level and which has a first surface (e.g., a bottom surface) and a second surface (e.g., a top surface) opposite the first surface. The semiconductor structure can further include a BDSCR on the substrate. The BDSCR can include a first well, which is within the substrate and which has a second type conductivity. The BDSCR can also include, within the first well, side sections (e.g., symmetric side sections) and a middle section positioned laterally between the side sections. Each side section can include: a second well, which has the first type conductivity; and a third well, which has the first type conductivity at a higher conductivity level than the second well and which is contained within the second well so that the sides and bottom of the third well are surrounded by the second well. Each side section can further include: a first contact region, which is at the second surface of the substrate adjacent to the second well, which is offset from the third well, and which has the first type conductivity at a higher conductivity level than the second well; and a second contact region, which is at the second surface of the substrate adjacent to the third well and which has the second type conductivity at a higher conductivity level than the fourth wells. The middle section can include multiple floating wells including: two floating fourth wells, which have the second type conductivity at a higher conductivity level than the first well; and a floating fifth well, which is positioned laterally between the fourth wells and which has the first type conductivity.

Another embodiment of the semiconductor structure disclosed herein can include a semiconductor substrate, which has a first type conductivity at a relatively low conductivity level and which has a first surface (e.g., a bottom surface) and a second surface (e.g., a top surface) opposite the bottom surface. The semiconductor structure can further include a BDSCR on the substrate. The BDSCR can include a first well, which is within the substrate and which has a second type conductivity. The BDSCR can also include, within the first well, side sections (e.g., symmetric side sections) and a middle section positioned laterally between the side sections. Each side section can include: a second well, which has the first type conductivity; and a third well, which has the first type conductivity at a higher conductivity level than the second well and which is only partially within the second well at an interface between the second well and the first well such that only one side surface and a portion of the bottom surface is surrounded by the second well. Each side section can further include: a first contact region, which is at the second surface of the substrate adjacent to the second well, which is offset from the third well, and which has the first type conductivity at a higher conductivity level than the second well; and a second contact region, which is at the second surface of the substrate adjacent to the third well and which has the second type conductivity at a higher conductivity level than the fourth wells. The middle section can include multiple floating wells including: two fourth wells, which have the second type conductivity at a higher conductivity level than the first well; and a floating fifth well, which is positioned laterally between the fourth wells and which has the first type conductivity.

Yet another embodiment of the semiconductor structure disclosed herein can include a semiconductor substrate, which has a first type conductivity at a relatively low conductivity level and which has a first surface (e.g., a bottom surface) and a second surface (e.g., a top surface) opposite the bottom surface. The semiconductor structure can further include a BDSCR on the substrate. The BDSCR can include a first well, which is within the substrate and which has a second type conductivity. The BDSCR can also include, within the first well, side sections (e.g., symmetric side sections) and a middle section positioned laterally between the side sections. Each side section can include: a second well, which has the first type conductivity; and a third well, which has the first type conductivity at a higher conductivity level than the second well and which is only partially within the second well at an interface between the second well and the first well such that only one side surface and a portion of the bottom surface is surrounded by the second well. Each side section can further include: a first contact region, which is at the second surface of the substrate adjacent to the third well and which has the first type conductivity at a higher conductivity level than the second well; and a second contact region, which is at the second surface of the substrate also adjacent to the third well and which has the second type conductivity at a higher conductivity level than the fourth wells. The middle section can include multiple floating wells including: two floating fourth wells, which have the second type conductivity at a higher conductivity level than the first well; and a floating fifth well, which is positioned laterally between the fourth wells and which has the first type conductivity.

In any case, by incorporating the multiple floating wells into the middle section of the symmetric BDSCR (e.g., as opposed to a single relatively wide floating well region), high current tolerance is improved without the need for a buried implant isolation region between the device and the substrate. Additionally, the device size can be scaled.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
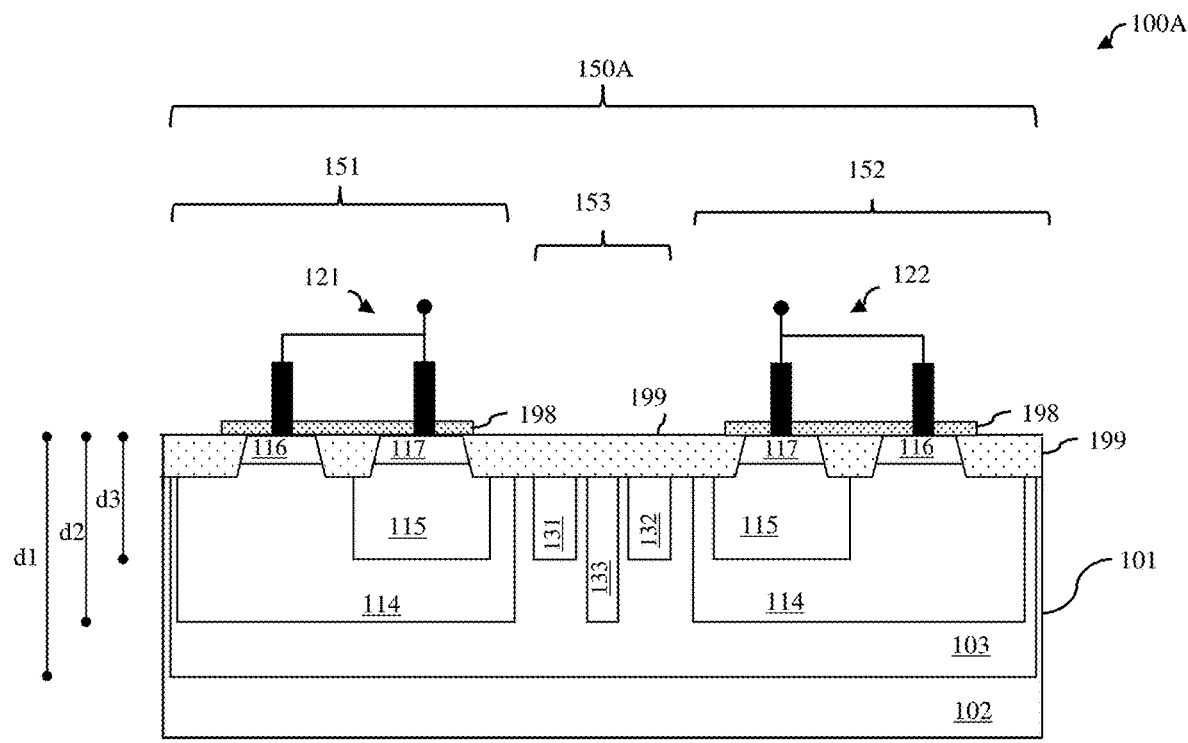
FIGS. 1A-1E are cross-section diagrams illustrating alternative embodiments of a disclosed semiconductor structure including a symmetric bi-directional silicon-controlled rectifier (BDSCR)

As mentioned above, fails due to electrostatic discharge (ESD) negatively impact the reliability of integrated circuits (ICs). IC designs typically include ESD protection devices (e.g., at input/output pads, at power pads and between power domains). Such ESD protection devices include, but are not limited to, diodes, transistors, and silicon-controlled rectifiers (SCRs). Recently, symmetric bi-directional silicon-controlled rectifiers (BDSCRs) have been developed for use as ESD protection devices. However, performance and, particularly, the high current carrying tolerance of these BDSCRs is limited. Techniques for overcoming this performance limitation include using a buried implant isolation region (e.g., an N-doped buried layer (NBL)) to lead the current deeper into the semiconductor substrate (which is undesirable because it increases processing complexity and, particularly, adds to the number of masks required during fabrication) and/or increasing the total width of BDSCRs (which is undesirable because it limits IC size scaling).

In view of the foregoing, disclosed herein are embodiments of a semiconductor structure, which includes a symmetric bi-directional silicon-controlled rectifier (BDSCR) designed to have a high current carrying tolerance without increasing processing complexity or area consumption. In each of the embodiments, the structure includes a semiconductor substrate (e.g., P-type conductivity) and a symmetric BDSCR on the substrate. This BDSCR can include, within the substrate, a first well (e.g., a low-doped deep Nwell) and, within the first well, symmetric side sections and a middle section positioned laterally between the side sections. Each side section can include second and third wells (e.g., Pwells), where the third well is shallower than and has a higher conductivity level than the second well. Each side section can also include a pair of N+ and P+ contact regions. Each middle section can include multiple floating wells including: two fourth wells (e.g., Nwells), which have a higher conductivity level than the first well, and a fifth well (e.g., another Pwell), which is positioned laterally between the fourth wells. By incorporating the multiple floating wells into the middle section of the symmetric BDSCR (e.g., as opposed to including only a single floating Nwell in the middle section), high current tolerance is improved without the need for a buried implant isolation region (e.g., an N-doped buried layer (NBL)) between the device and the substrate. Additionally, the device size can be scaled. Variations in the disclosed embodiments include, but are not limited to, variations with regard to the placement of the third well relative to the second well and further relative to the contact regions within each side section, variations with regard to the placement of shallow trench isolation (STI) regions at the top surface of the substrate and dielectric layers on the top surface of the substrate, and variations with regard to the presence or absence of gate structures.

More particularly, FIGS. 1A, 1B, 1C, 1D, and 1E are cross-section diagrams illustrating alternative embodiments of a semiconductor structure 100A, 100B, 100C, 100D, and 100E including a symmetric bi-directional silicon-controlled rectifier (BDSCR) 150A, 150B, 150C, 150D, and 150E, respectively. FIGS. 2A, 2B, 2C, 2D, and 2E are cross-section diagrams illustrating alternative embodiments of a semiconductor structure 200A, 200B, 200C, 200D, and 200E including a symmetric BDSCR 250A, 250B, 250C, 250D, and 250E, respectively. FIGS. 3A, 3B, 3C, 3D, and 3E are cross-section diagrams illustrating alternative embodiments of a semiconductor structure 300A, 300B, 300C, 300D, and 300E including a symmetric BDSCR 350A, 350B, 350C, 350D, and 350E, respectively.

In each of these embodiments, the semiconductor structure 100A-100E, 200A-200E, 300A-300E can include a semiconductor substrate 101, 201, 301. The semiconductor substrate 101, 201, 301 can, for example, be a bulk silicon substrate or some other suitable bulk semiconductor substrate. The semiconductor substrate 101, 201, 301 can have a first surface (e.g., a bottom surface) and a second surface (e.g., a top surface) opposite the bottom surface. The semiconductor substrate 101, 201, 301 can be doped so as to have a first type conductivity at a relative low conductivity level. Those skilled in the art will recognize that, typically, bulk silicon substrate used in integrated circuit manufacturing are typically doped so as to have P-type conductivity at a relatively low conductivity level (i.e., P-conductivity). Thus, preferably and in the examples provided, the first type conductivity refers to P-type conductivity and the second type conductivity refers to N-type conductivity and the. However, it should be understood that, alternatively, the first type conductivity could refer to N-type conductivity and the second type conductivity could refer to P-type conductivity.

The semiconductor structure 100A-100E, 200A-200E, 300A-300E can further include a symmetric BDSCR 150A-150E, 250A-250E, 350A-350E on the substrate 101, 201, 301. In each of the embodiments, the BDSCR 150A-150E, 250A-250E, 350A-350E can include a first well 103, 203, 303 (i.e., a first dopant implant region) within the substrate 101, 201, and 301. The first well 103, 203, 303 can extend to from the second surface of the substrate 101, 201, 301 to a first depth (d1) below the second surface such that the bottom of the first well is some distance above the level of the first surface. The first well 103, 203, 303 can be, for example, a deep N-type well region at a relatively low conductivity level (e.g., a deep N-well, also referred to herein as a dual voltage Nwell (DVNWELL)) and the bottom of this well N-well can be immediately adjacent to a lower portion 102, 202, 302 of a P-substrate.

The BDSCR 150A-150E, 250A-250E, 350A-350E can also include, within the first well 103, 203, 303, essentially symmetric side sections 151-152, 251-252, 351-352 (also referred to herein as emitter regions) and a middle section 153, 253, 353 (also referred to herein as a collector region) positioned laterally between the side sections 151-152, 251-252, 351-352.

Each side section 151-152, 251-252, 351-352 can include a second well 114, 214, 314 with the first type conductivity at, for example, a somewhat higher conductivity level than the substrate. For example, the second well 114, 214, 314 can be a high voltage Pwell (HVPWell) with a somewhat higher conductivity level than the P-substrate. The second well 114, 214, 314 can extend from the second surface of the substrate to a second depth (d2), which is less than the first depth (d1). Each side section 151-152, 251-252, 351-352 can also include a third well 115, 215, 315 with the first type conductivity at a higher conductivity level than the second well 114, 214, 314. For example, the third well 115, 215, 315 can be a middle voltage Pwell (MVPwell) with a somewhat higher conductivity level than both the second well 114, 214, 314 and the P-substrate. In any case, the third well 115, 215, 315 can extend from the second surface of the substrate to a third depth (d3), which is less than the second depth (d2). The third well 115, 215, 315 can be immediately adjacent to the second well 114, 214, 314; however, as discussed in greater detail below with regard to the alternative embodiments disclosed herein placement of the third well 115, 215, 315 relative to the second well 114, 214, 314 can vary.

Each side section 151-152, 251-252, 351-352 can further include a first contact region 116, 216, 316 with the first type conductivity at a relatively high conductivity level and, particularly, at a higher conductivity level that the second and third wells (e.g., a P+ contact region). Each side section 151-152, 251-252, 351-352 can also include a second contact region 117, 217, 317 with the second type conductivity also at a relatively high conductivity level (e.g., an N+ contact region). As discussed in greater detail below with regard to the alternative embodiments disclosed herein placement of the contact regions relative to the second and third wells can vary. However, the first and second contact regions 116-117, 216-217, 316-317 of one side section (e.g., side section 151, 251, 351) can be connected to one terminal 121, 221, 321 (e.g., an anode terminal) and the first and second contact regions 116-117, 216-217, 316-317 of the other side section (e.g., side section 152, 252, 352) can be connected to a different terminal 122, 222, 322 (e.g., a cathode terminal).

The middle section 153, 253, and 353 can be essentially evenly spaced from the symmetrical side sections 151-152, 251-252, 351-352 with portions of the first well 103, 203, 303 separating the middle section from the side sections. The middle section 153, 253, and 353 can include multiple floating wells (i.e., non-contacted, non-biased well regions, also referred to herein as drifting wells).

The floating wells of the middle section can include two essentially identical fourth wells 131-132, 231-232, 331-332. The fourth wells 131-132, 231-232, 331-332 can have the second type conductivity at a higher conductivity level than the first well. For example, if the first well is a DVNwell with a relatively low N-type conductivity level, then the fourth wells that sit in the first well can be Nwells (also referred to herein as middle voltage Nwells (MVNwells)) with a higher N-type conductivity level than the first well. In any case, the fourth wells 131-132, 231-232, 331-332 can extend from the second surface of the substrate to approximately the same third depth (d3) as the third wells 115, 215, 315 of the side section 151-152, 251-252, 351-352.

The floating wells can also include a fifth well 133, 233, 333, which is positioned laterally between the fourth wells 131-132, 231-232, 331-332. The fifth well 133, 233, 333 can be essentially evenly spaced from the adjacent fourth wells 131-132, 231-232, 331-332 with portions of the first well 103, 203, 303 separating the fifth well from the fourth wells. The fifth well 133, 233, 333 can have the first type conductivity at, for example, essentially the same conductivity level as the second wells 114, 214, 314 of the side sections 151-152, 251-252, 351-352. Thus, for example, the fifth well 133, 233, 333 can also be a high voltage Pwell (HVPWell). Alternatively, the fifth well 133, 233, 333 can be a P-type well region with a different P-type dose than the second well regions. For example, the fifth well 133, 233, 333 could be an HVPWell+MVPwell or some other P-type well region. In any case, the fifth well 133, 233, 333 can extend from the second surface of the substrate to approximately the same second depth (d2) as the second wells 114, 214, 314. Thus, for example, fifth well is relatively long as compared to the fourth wells (as measured in a direction essentially perpendicular to the first and second surfaces of the substrate).

It should be noted that the fourth and fifth well can be relatively narrower in width and can have a relatively high aspect ratio as compared the other well regions described above.

Differences in alternative embodiments disclosed herein can include, but are not limited to, differences in placement of the third well relative to the second well in each side section, differences in placement of contact regions relative to the second and third wells within each side section, differences in the placement and type of isolation structure above the fourth wells and the fifth well of the middle section, and differences in the presence or absence of gate structures.

For example, in various embodiments of the semiconductor structure 100A, 100B, 100C and 100D shown in FIGS. 1A, 1B, 1C, 1D, and 1E, respectively, within each side section 151-152, the second well 114 can have a proximal portion adjacent to the middle section 153 and a distal portion away from the middle section. The third well 115 can be contained within the proximal portion of the second well 114 such that the sides and bottom of the third well 115 are surrounded by the second well 114. Additionally, within each side section, the first contact region 116 with the first type conductivity (e.g., the P+ contact region) can be at the second surface of the substrate adjacent to the distal portion of the second well 114 and, particularly, offset from the third well 115. The second contact region 117 with the second type conductivity (e.g., the N+ contact region) can be at the second surface of the substrate adjacent to the third well 115.

In the various embodiments of the semiconductor structure 200A, 200B, 200C and 200D shown in FIGS. 2A, 2B, 2C, 2D, and 2E, respectively, within each side section 251-252, the third well 215 can be contained only partially within the second well 214. That is, the third well 215 can have a proximal portion adjacent to the middle section and a distal portion away from the middle section. The distal portion only of the third well 215 can extend into the second well 214 such that the side of the third well farthest from the middle section and the adjacent portion of the bottom of the third well 215 are surrounded by and immediately adjacent to the second well 214 and such that the side of the third well closest to the middle section and the adjacent portion of the bottom of the third well 215 are surrounded by and immediately adjacent to the first well 203. Additionally, within each side section, the first contact region 216 with the first type conductivity (e.g., the P+ contact region) can be at the second surface of the substrate adjacent to the second well 214 and, particularly, offset from the third well 215. The second contact region 217 with the second type conductivity (e.g., the N+ contact region) can be at the second surface of the substrate adjacent to the third well 215.

In the various embodiments of the semiconductor structure 300A, 300B, 300C and 300D shown in FIGS. 3A, 3B, 3C, 3D, and 3E, respectively, within each side section 351-352, the third well 315 can be contained only partially within the second well 314. That is, the third well 315 can have a proximal portion adjacent to the middle section and a distal portion away from the middle section. The distal portion only of the third well 315 can extend into the second well 314 such that the side of the third well farthest from the middle section and the adjacent portion of the bottom of the third well 315 are surrounded by and immediately adjacent to the second well 314 and such that the side of the third well closest to the middle section and the adjacent portion of the bottom of the third well 315 are surrounded by and immediately adjacent to the first well 303. Additionally, within each side section, both the first contact region 316 with the first type conductivity (e.g., the P+ contact region) and the second contact region 317 with the second type conductivity (e.g., the N+ contact region) can be at the second surface of the substrate adjacent to third well 315.

Additionally, as mentioned above, alternative embodiments can also vary with regard to differences in the placement and type of isolation structure above the fourth wells and the fifth well of the middle section and differences in the presence or absence of gate structures.

Figure 2A:
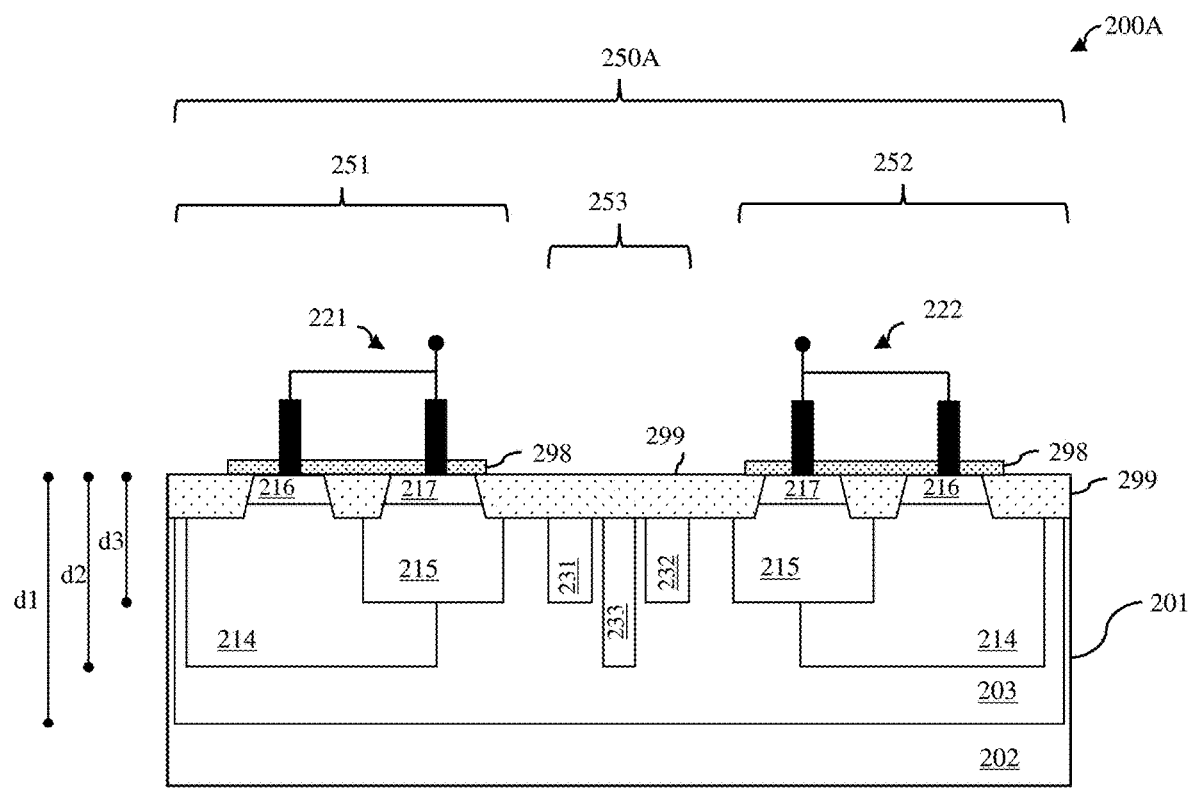
FIGS. 2A-2E are cross-section diagrams illustrating alternative embodiments of another disclosed semiconductor structure including a symmetric BDSCR.
Figure 3A:
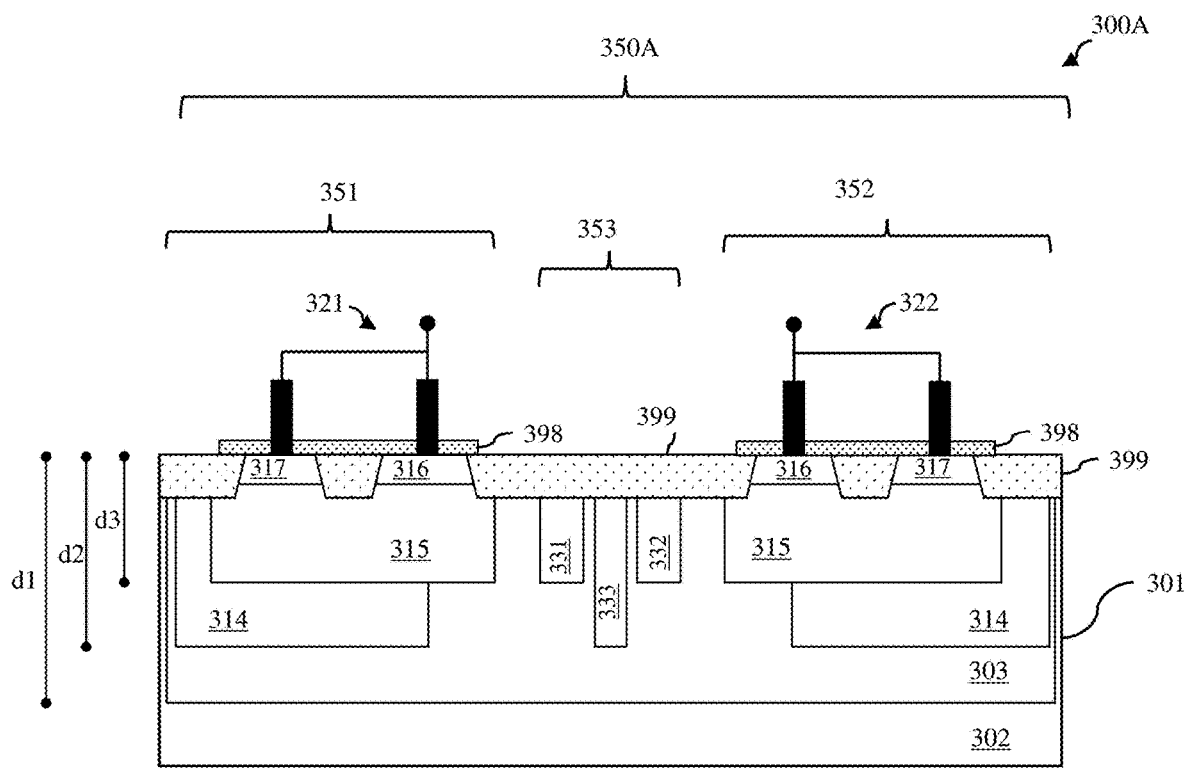
FIGS. 3A-3E are cross-section diagrams illustrating alternative embodiments of yet another disclosed semiconductor structure including a symmetric BDSCR.

For example, the embodiments of the semiconductor structure 100A, 200A, and 300A shown in FIGS. 1A, 2A and 3A, respectively, can further include shallow trench isolation (STI) regions 199, 299, 399 at the second surface of the substrate 101, 201, 301 in both the side sections 151-152, 251-252, 351-352 and the middle section 153, 253, 353. In the side sections, STI regions can laterally surround the first and second contact regions 116-117, 216-217, 316-317, can extend between the first and second contact regions 116-117, 216-217, 316-317 and can further cover portions of the third, second and first wells at the second surface of the substrate. An additional STI region can also extend laterally between the side sections over the fourth wells 131-132, 231-232, 331-332 and the fifth well 133, 233, 333 of the middle section 153, 253, 353. The embodiments of the semiconductor structure 100A, 200A, and 300A shown in FIGS. 1A, 2A and 3A, respectively, can also include dielectric layers 198, 298, 398 (also referred to herein as silicidation blocking layers (SBLs)) on the second surface of the substrate above the side sections. Specifically, a dielectric layer on each side section can cover the first and second contact regions 116-117, 216-217, 316-317 and the STI regions adjacent thereto. The dielectric layers 198, 298, 398 can, for example, be silicon nitride layers or some other suitable type of dielectric layers that can be employed during processing to prevent silicide formation on the first and second contact regions. In any case, each dielectric layer 198, 298, 398 on each side section can extends laterally to and, optionally, on to an edge of the STI region that extends laterally between the side sections.

Figure 1B:
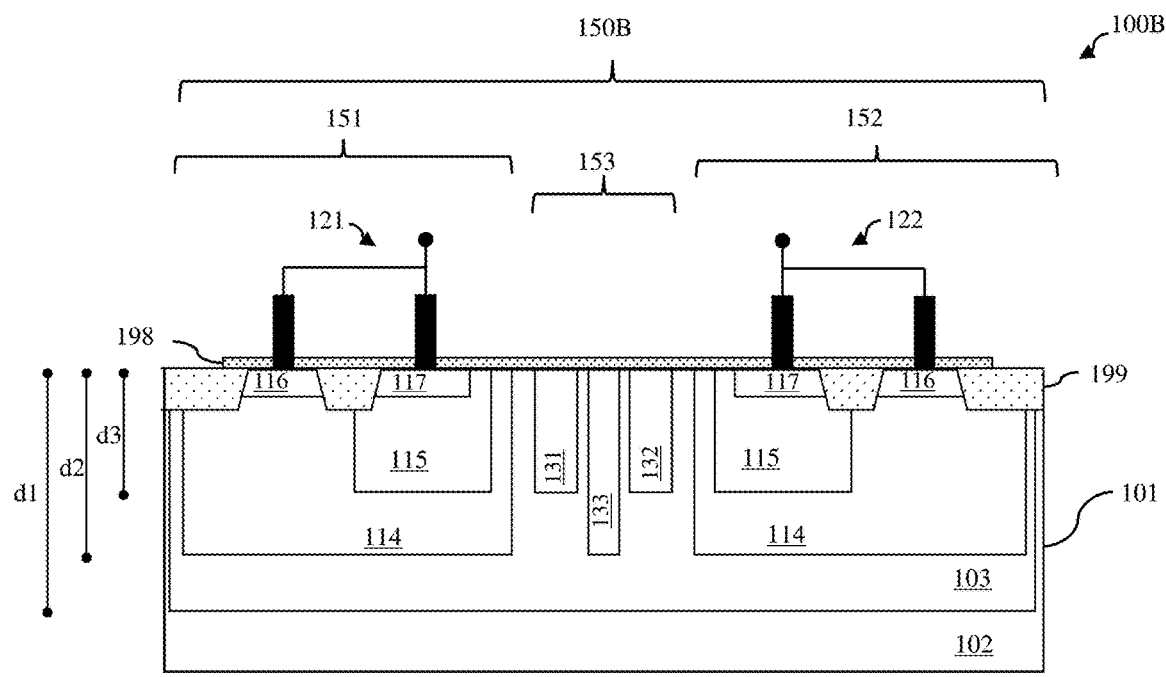
Figure 2B:
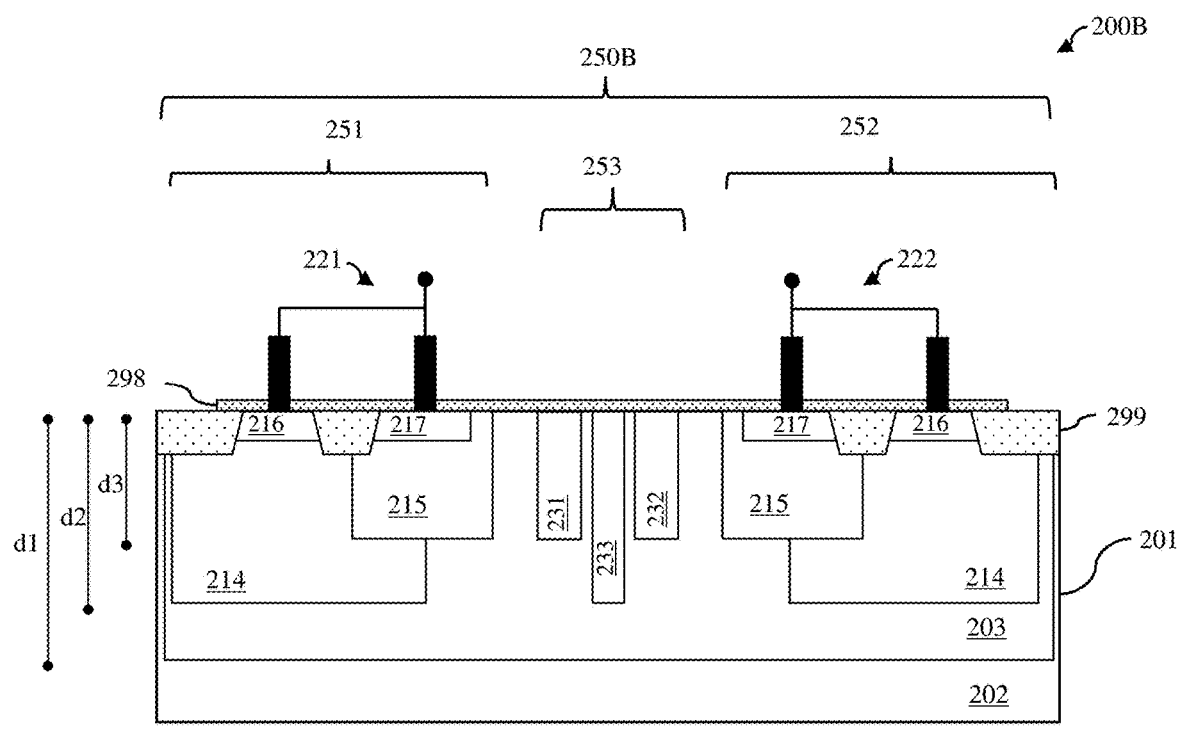
Figure 3B:
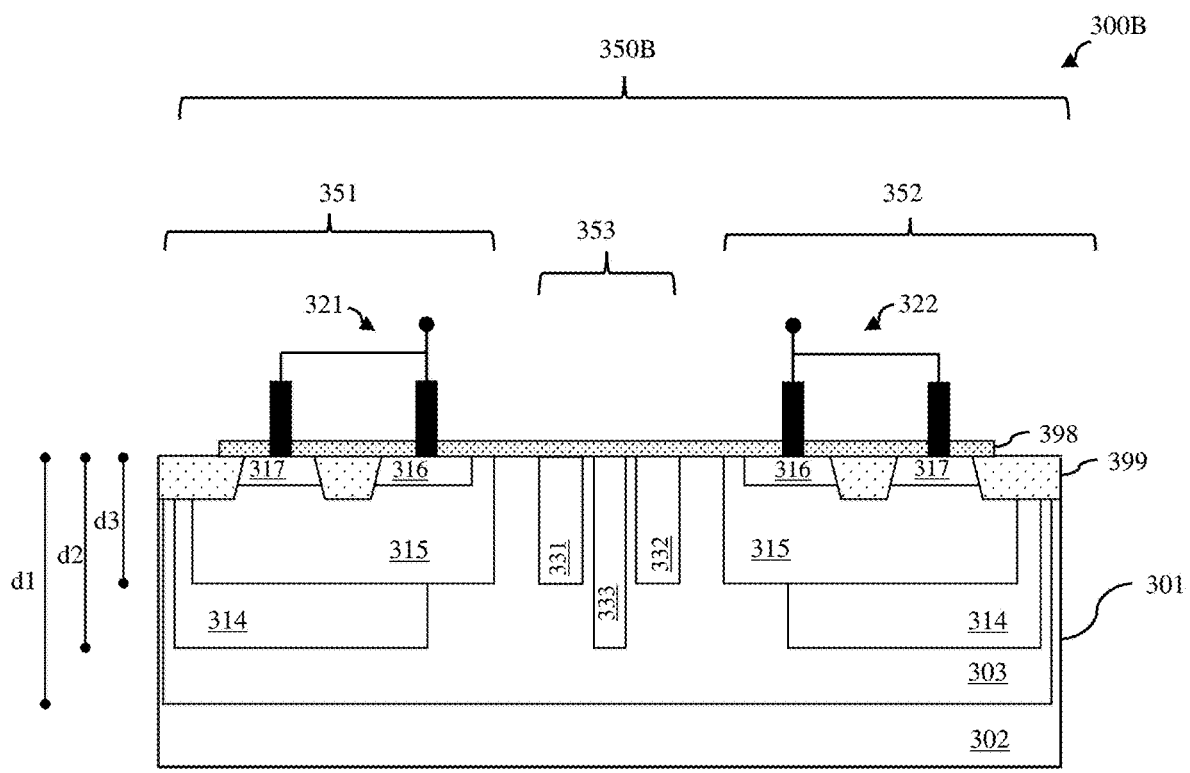

The embodiments of the semiconductor structure 100B, 200B, and 300B shown in FIGS. 1B, 2B and 3B, respectively, can further include shallow trench isolation (STI) regions 199, 299, 399 at the second surface of the substrate 101, 201, 301 in the side sections 151-152, 251-252, 351-352, but not in the middle section 153, 253, 353. In the side sections, STI regions can laterally surround the first and second contact regions 116-117, 216-217, 316-317, can extend between the first and second contact regions 116-117, 216-217, 316-317 and can further cover portions of the third, second and first wells at the second surface of the substrate. The embodiments of the semiconductor structure 100B, 200B, and 300B shown in FIGS. 1B, 2B and 3B, respectively, can include a single continuous dielectric layer 198, 298, 398 (also referred to herein as a silicidation blocking layer (SBL)) on the second surface of the substrate above the side sections 151-152, 251-252, 351-352 and further extending between the side sections over the middle section 153, 253, 353. Specifically, the continuous dielectric layer can cover the contact regions and adjacent STI in each of the side sections and can further extend over the wells within the middle section 153, 253, 353. This single dielectric layer 198, 298, 398 can, for example, be a silicon nitride layer or some other suitable type of dielectric layer that can be employed during processing to prevent silicide formation on the first and second contact regions in the side sections and further on semiconductor material surfaces across the middle section and between the middle section and the side sections.

Figure 1C:
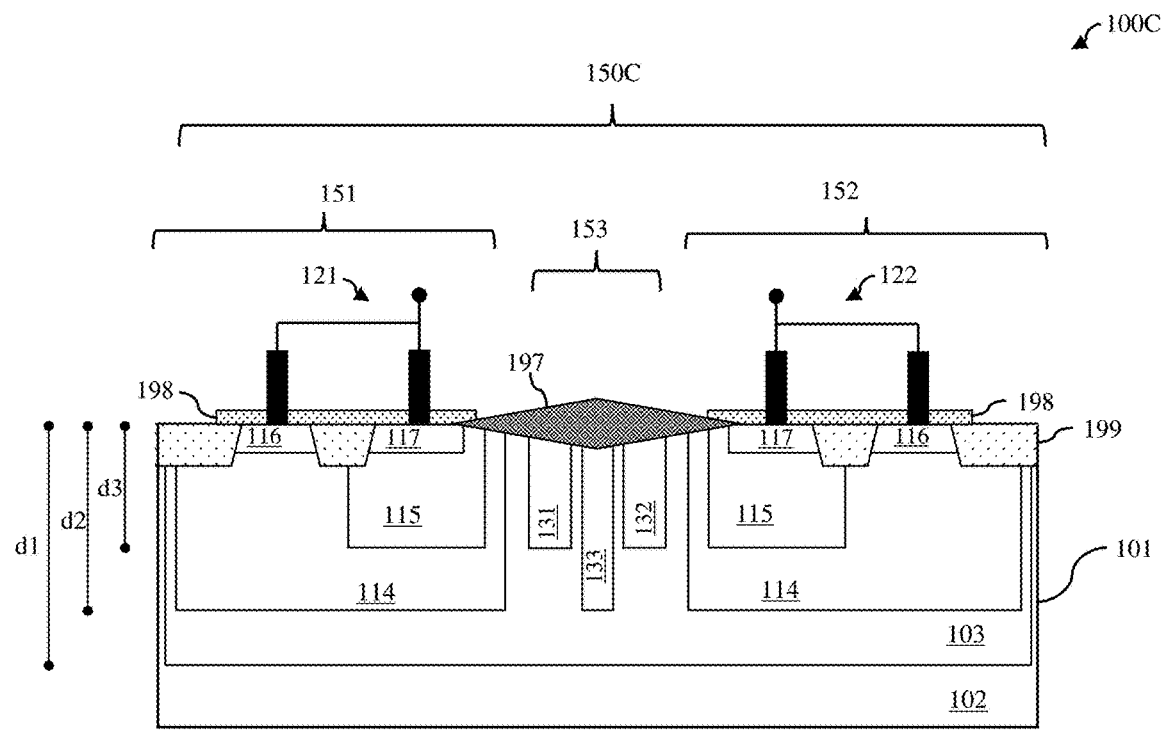
Figure 2C:
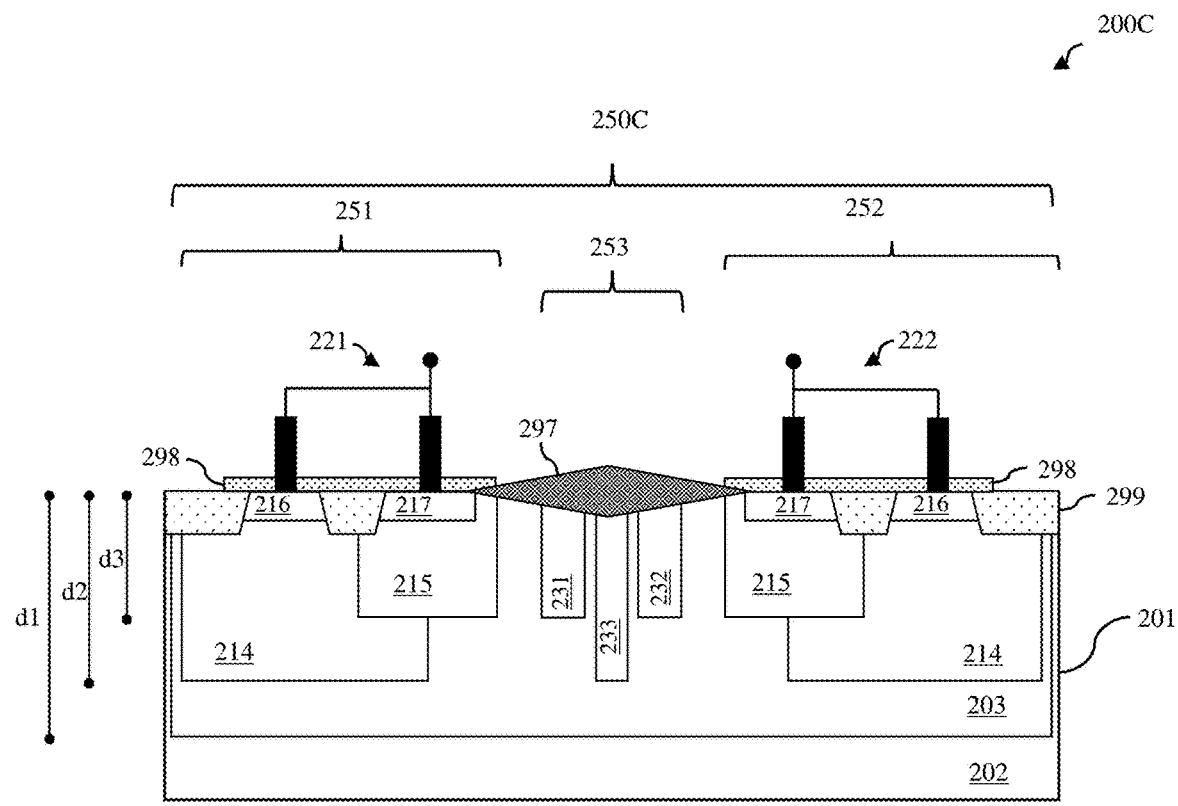
Figure 3C:
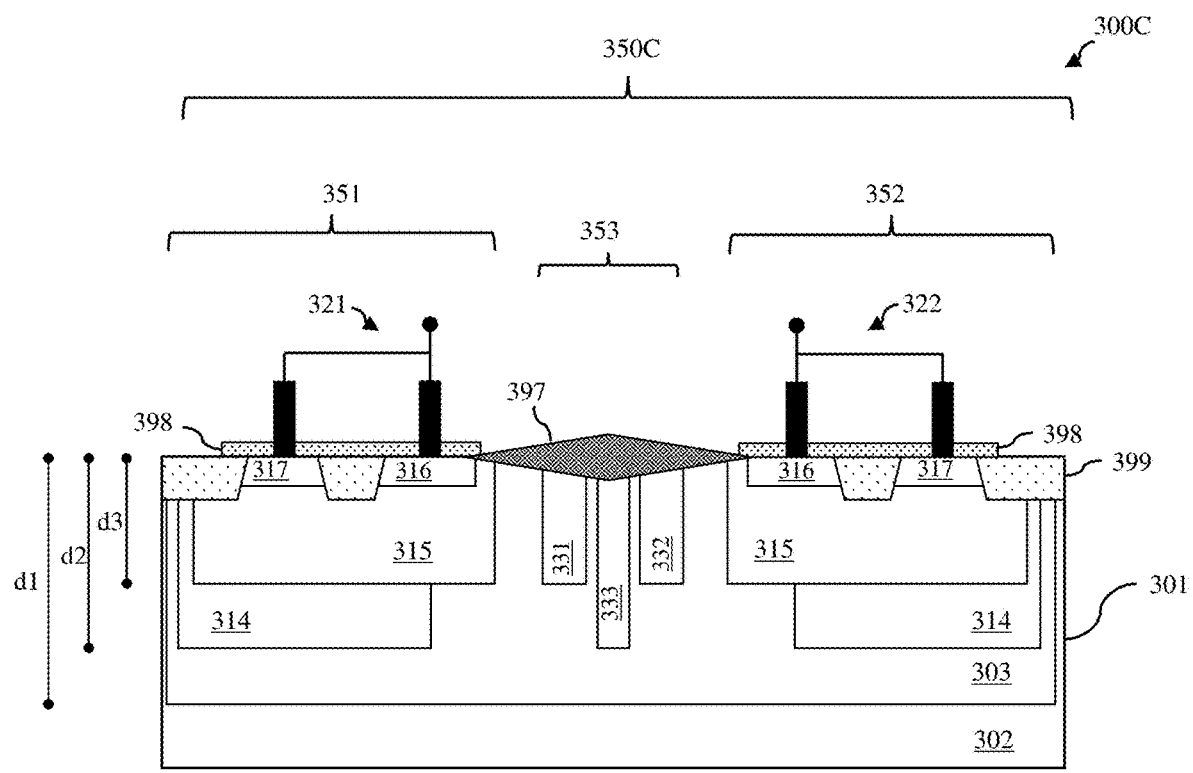

The embodiments of the semiconductor structure 100C, 200C, and 300C shown in FIGS. 1C, 2C and 3C, respectively, can further include shallow trench isolation (STI) regions 199, 299, 399 at the second surface of the substrate 101, 201, 301 in the side sections 151-152, 251-252, 351-352 only. Specifically, in the side sections, STI regions can laterally surround the first and second contact regions 116-117, 216-217, 316-317, can extend between the first and second contact regions 116-117, 216-217, 316-317 and can further cover portions of the third, second and first wells at the second surface of the substrate. The embodiments of the semiconductor structure 100C, 200C, and 300C shown in FIGS. 1C, 2C and 3C, respectively, can also include dielectric layers 198, 298, 398 (also referred to herein as silicidation blocking layers (SBLs)) on the second surface of the substrate above the side sections. Specifically, a dielectric layer on each side section can cover the first and second contact regions 116-117, 216-217, 316-317 and the STI regions adjacent thereto. The dielectric layers 198, 298, 398 can, for example, be silicon nitride layers or some other suitable type of dielectric layers that can be employed during processing to prevent silicide formation on the first and second contact regions. The embodiments of the semiconductor structure 100C, 200C, 300C shown in FIGS. 1C, 2C and 3C, respectively, can further include an oxide region, such as a local oxidation of silicon (LOCOS) region 197, 297, 397, that extends laterally between the dielectric layers on the side sections over the fourth wells 131-132, 231-232, 331-332 and the fifth well 133, 233, 333 of the middle section 153, 253, 353.

Figure 1D:
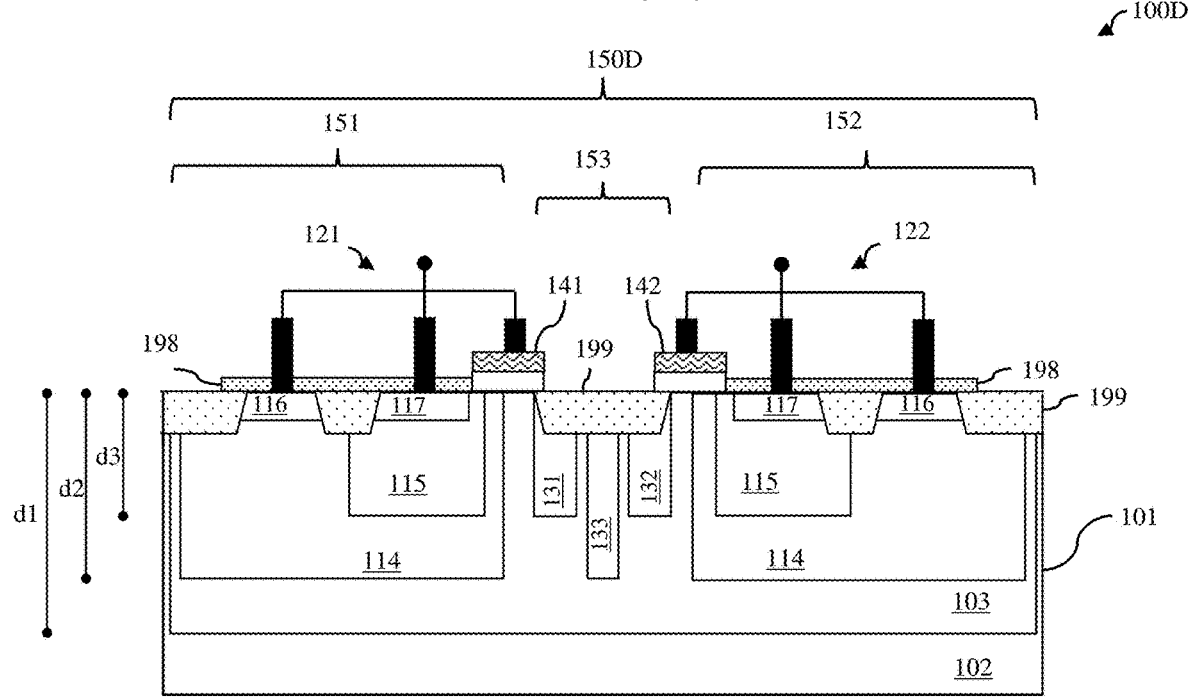
Figure 2D:
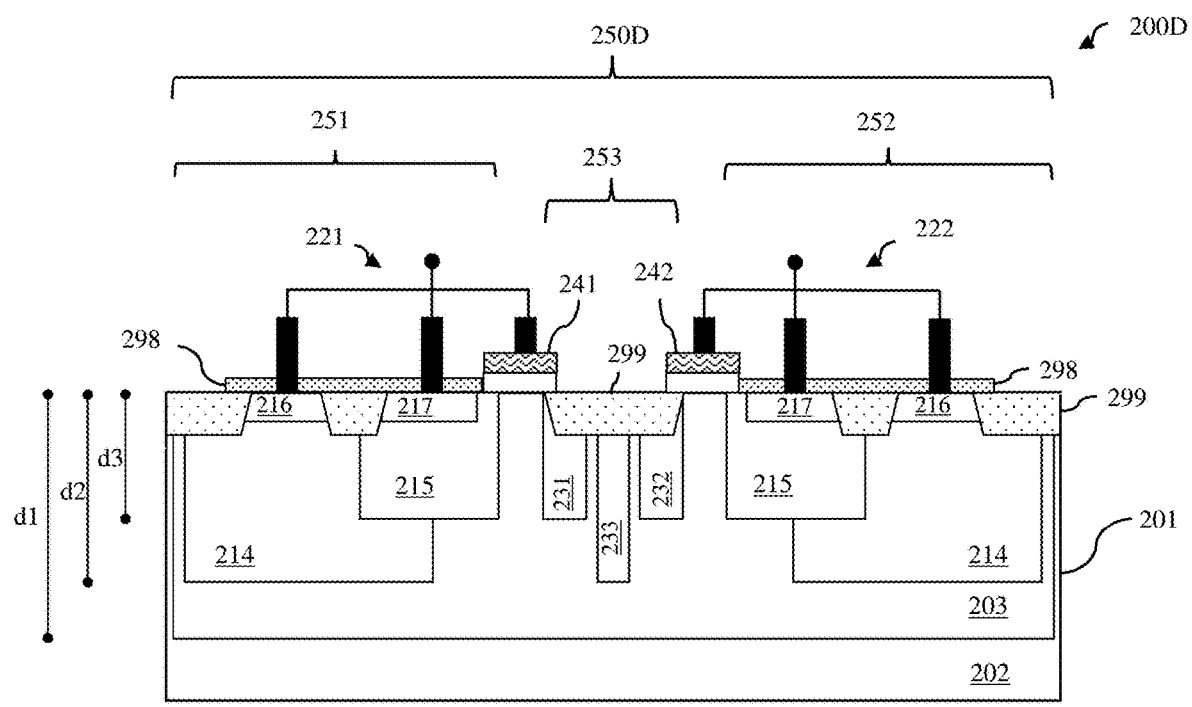
Figure 3D:
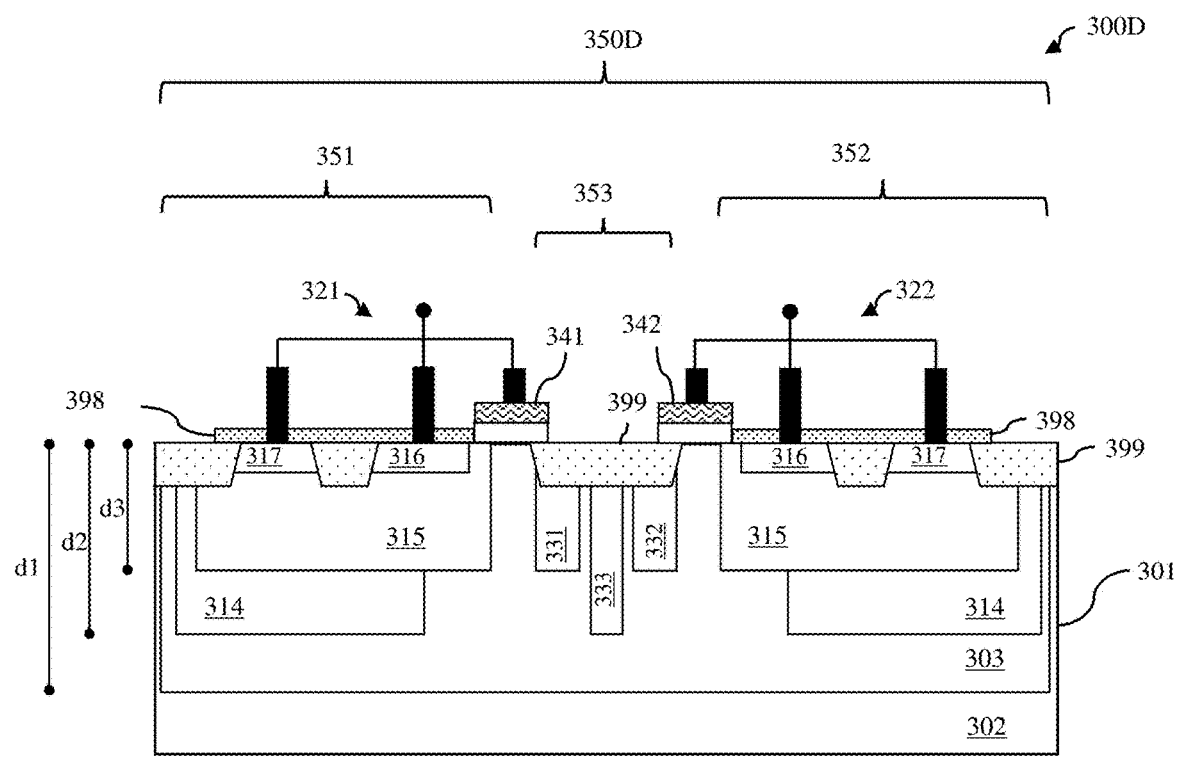

The embodiments of the semiconductor structure 100D, 200D, and 300D shown in FIGS. 1D, 2D and 3D, respectively, can further include shallow trench isolation (STI) regions, 199, 299, 399 at the second surface of the substrate 101, 201, 301 in both the side sections 151-152, 251-252, 351-352 and the middle section 153, 253, 353. In the side sections, STI regions can laterally surround the first and second contact regions 116-117, 216-217, 316-317, can extend between the first and second contact regions 116-117, 216-217, 316-317 and can further cover portions of the third, second and first wells at the second surface of the substrate. An additional STI region can also be positioned over the fourth wells 131-132, 231-232, 331-332 and the fifth well 133, 233, 333 of the middle section 153, 253, 353. The embodiments of the semiconductor structure 100D, 200D, and 300D shown in FIGS. 1D, 2D and 3D, respectively, can also include dielectric layers 198, 298, 398 (also referred to herein as silicidation blocking layers (SBLs)) on the second surface of the substrate above the side sections. Specifically, a dielectric layer on each side section can cover the first and second contact regions 116-117, 216-217, 316-317 and the STI regions adjacent thereto. The dielectric layers 198, 298, 398 can, for example, be silicon nitride layers or some other suitable type of dielectric layers that can be employed during processing to prevent silicide formation on the first and second contact regions. The embodiments of the semiconductor structure 100D, 200D, and 300D shown in FIGS. 1D, 2D and 3D, respectively, can further gate structures 141-142, 241-242, 342-342 on either side of the middle section 153, 253, 353. That is, one gate structure 141, 241, 341 can be on the second surface of the substrate above the first well 103, 203, 303 between one side section 151, 251, 351 and the middle section 153, 253, 353 and another gate structure 142, 242, 342 can be on the second surface of the substrate above the first well 103, 203, 303 between the opposite side section 152, 252, 352 and the middle section 153, 253, 353. Each gate structure 141-142, 241-242, 341-342 can include one or more gate dielectric layers and one or more gate conductor layers on the gate dielectric layer. For example, one exemplary gate structure can include a polysilicon oxynitride (poly-SiON) gate dielectric layer and a metal gate layer on the gate dielectric layer. As illustrated, the gate structure 141, 241, 341 can be tied to one terminal (e.g., the adjacent anode terminal 121, 221, 321) and the gate structure 142, 242, 342 can be tied to the other terminal (e.g., to the adjacent cathode terminal 122, 222, 322).

Figure 1E:
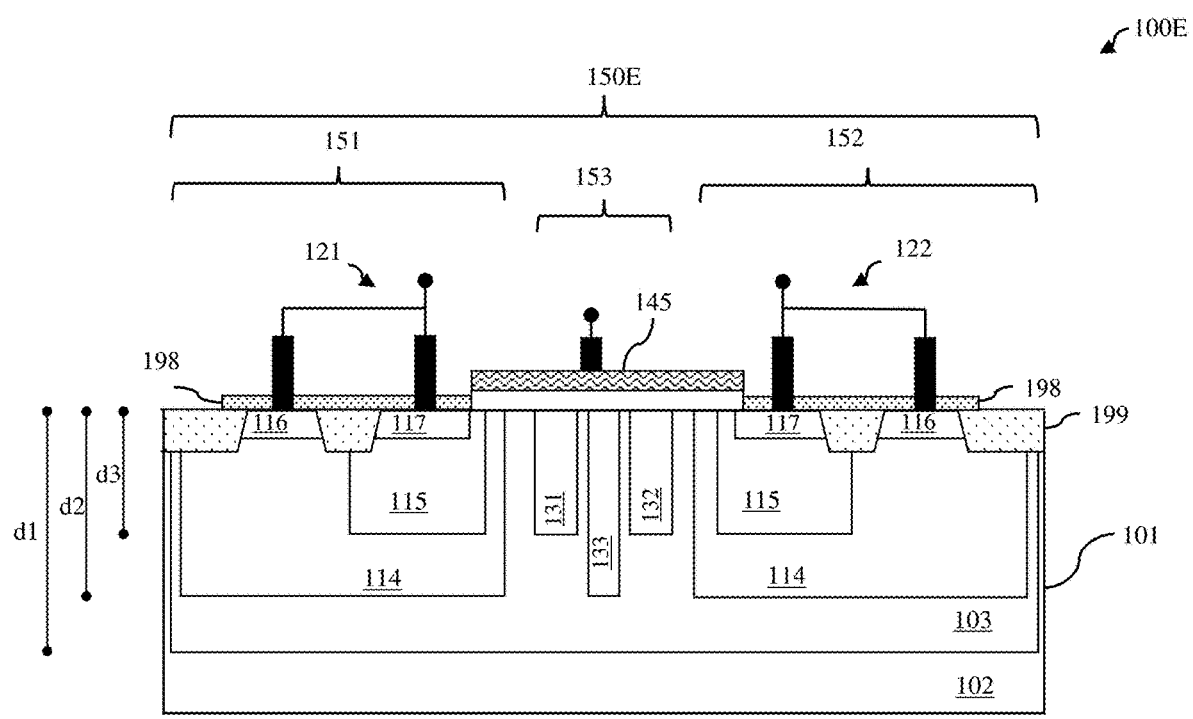
Figure 2E:
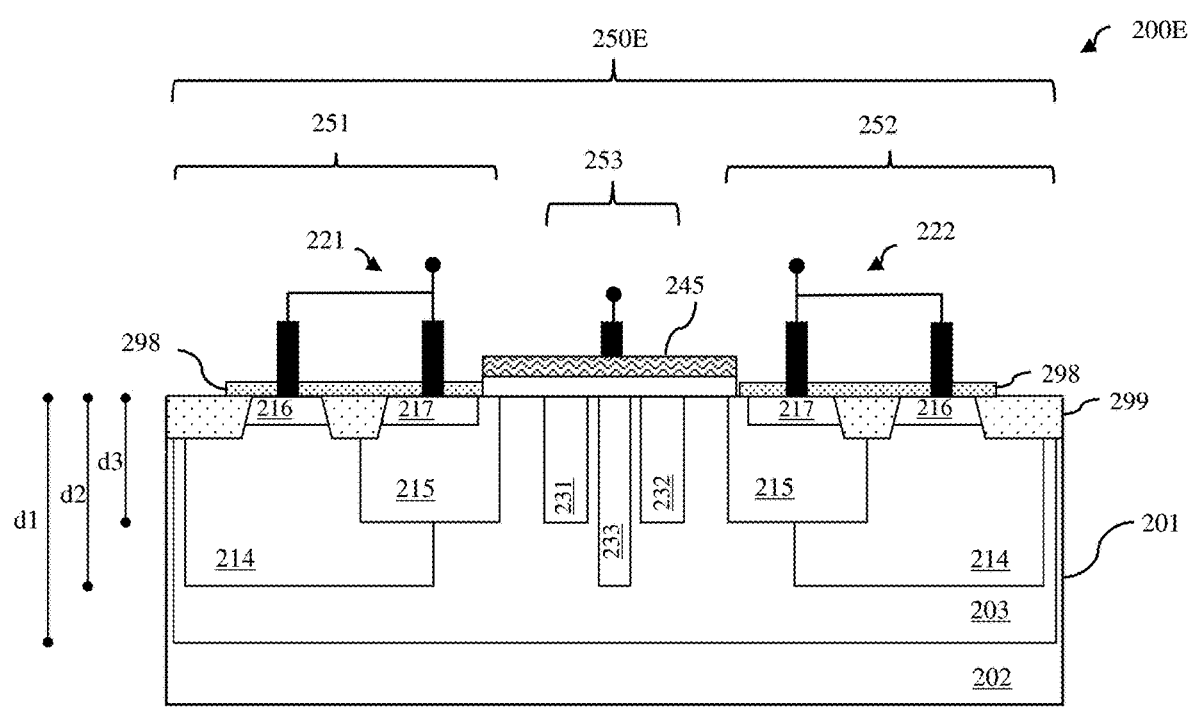
Figure 3E:
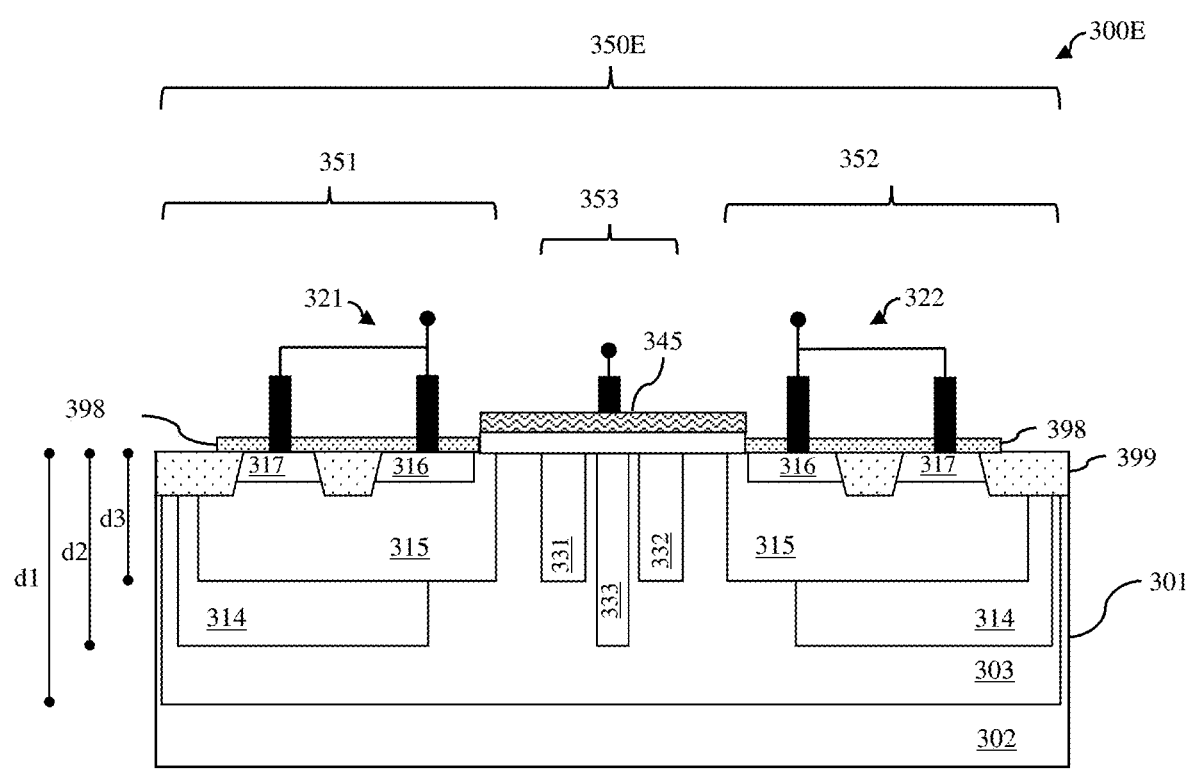

The embodiments of the semiconductor structure 100E, 200E, and 300E shown in FIGS. 1E, 2E and 3E, respectively, can further include shallow trench isolation (STI) regions, 199, 299, 399 at the second surface of the substrate 101, 201, 301 in both the side sections 151-152, 251-252, 351-352. In the side sections, STI regions can laterally surround the first and second contact regions 116-117, 216-217, 316-317, can extend between the first and second contact regions 116-117, 216-217, 316-317 and can further cover portions of the third, second and first wells at the second surface of the substrate. The embodiments of the semiconductor structure 100E, 200E, and 300E shown in FIGS. 1E, 2E and 3E, respectively, can also include dielectric layers 198, 298, 398 (also referred to herein as silicidation blocking layers (SBLs)) on the second surface of the substrate above the side sections. Specifically, a dielectric layer on each side section can cover the first and second contact regions 116-117, 216-217, 316-317 and the STI regions adjacent thereto. The dielectric layers 198, 298, 398 can, for example, be silicon nitride layers or some other suitable type of dielectric layers that can be employed during processing to prevent silicide formation on the first and second contact regions. The embodiments of the semiconductor structure 100E, 200E, 300E shown in FIGS. 1E, 2E and 3E, respectively, can further a single gate structures 145, 245, 345 that extends across the middle section 153, 253, 353 between the two side sections. This gate structure 145, 245, 345 can include one or more gate dielectric layers and one or more gate conductor layers on the gate dielectric layer. For example, one exemplary gate structure can include a polysilicon oxynitride (poly-SiON) gate dielectric layer and a metal gate layer on the gate dielectric layer. As illustrated, the gate structure 145, 245, 345 can be contacted separately from the terminals 121-122, 221-222, 321-322.

Figure 4:
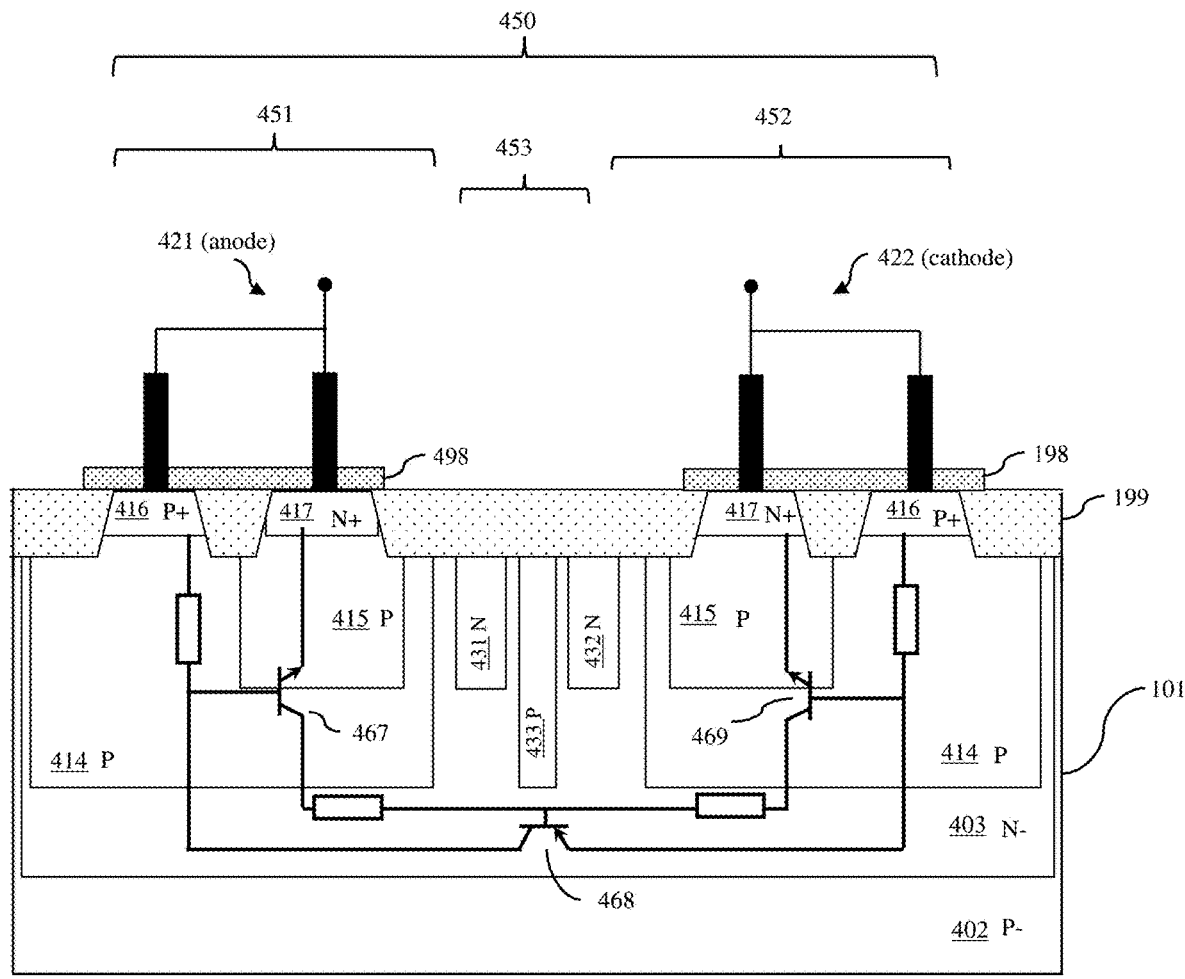
FIG. 4 is a cross-section diagram illustrating one of the exemplary embodiments (e.g., the semiconductor structure 100A of FIG. 1A) overlayed with a corresponding circuit diagram.

FIG. 4 is a cross-section diagram illustrating one of the exemplary embodiments (e.g., the embodiments 100A of FIG. 1A) overlayed with a circuit diagram corresponding to the structure. In this structure, if a positive pulse is applied across the two terminals (e.g., the anode terminal 421 and the cathode terminal 422), then the NPN transistor 469 and the PNP transistor 468 will turn on and a first SCR directional device, which is defined by p-n-p-n regions including Pwells 414-415 of side section 451, Nwell 403 across the middle section 453, Pwells 414-415 of side section 452, and N+ contact region 417 of side section 452, of the BDSCR is triggered into a snap-back mode. If a negative pulse is applied across the two terminals (e.g., the anode terminal 421 and the cathode terminal 422), then the NPN transistor 467 and the PNP transistor 468 will turn on and a second SCR directional device, which is defined by p-n-p-n regions including Pwells 414-415 of side section 452, Nwell 403 across the middle section 453, Pwells 414-415 of side section 451, and N+ contact region 417 of side section 451, of the BDSCR is triggered into a snap-back mode.

In these structures, the floating Nwells 431-432 are included to make the BDSCR symmetrical and to achieve the bi-directional characteristics. The floating Pwell 433 inserted between the floating Nwells limits the flow of current in the lateral direction at the surface of the device and further directions current flow deeper into the substrate. Thus, by incorporating the multiple floating wells (e.g., a floating Pwell between floating Nwells) into the middle section of the symmetric BDSCR of the disclosed embodiments, high current tolerance is improved (i.e., the device is more robust).

Figure 5:
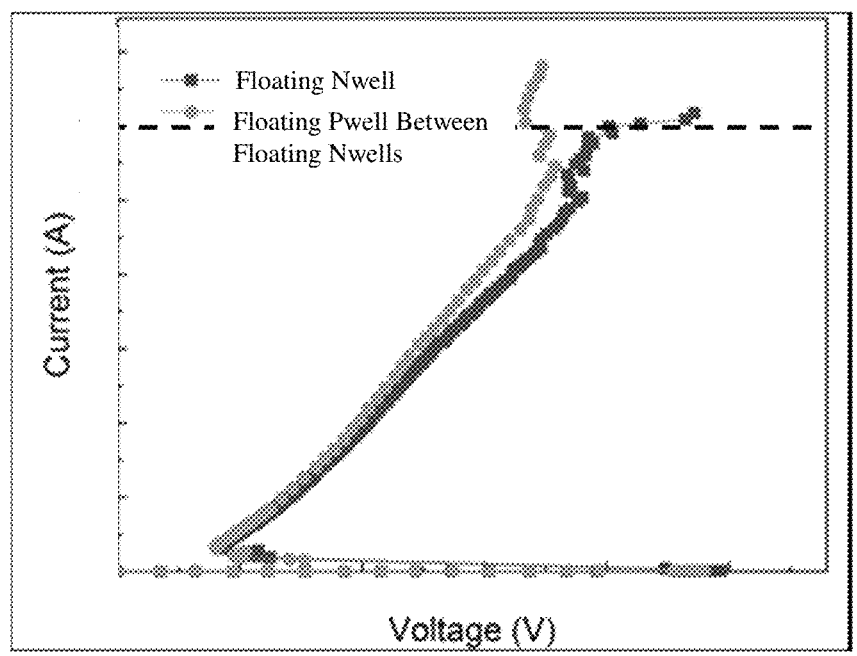
FIG. 5 is a graph contrasting TLP curves of a BDSCR with a middle section including a single Nwell between side sections and a BDSCR with a middle section including a Pwell inserted between a pair of Nwells, as in each of the disclosed semiconductor structures.

For example, as illustrated by the exemplary transmission line pulse (TLP) curves in the graph of FIG. 5, in a BDSCR where the middle section (i.e., the collector) includes a single floating Nwell saturation of current occurs at a relatively low level (e.g., above approximately 12 amperes (A)), as indicated by the dashed horizontal line; whereas in disclosed BDSCRs (e.g., see the BDSCRs 150A-150E of FIGS. 1A-1E, 250A-250E of FIGS. 2A-2E, and 350A-350E of FIGS. 3A-3E) where the middle section 153, 253, 353 (i.e., the collector) includes a floating Pwell positioned laterally between floating Nwells saturation of current occurs at a significantly higher level (e.g., over approximately 14 amperes or higher). Additionally, manufacturing complexity is reduced by elimination of the need for a buried implant isolation region (e.g., a buried N-doped) and device size can be scaled.

Generally, methods for forming the various wells in a substrate, as described above, can include performing masked dopant implantation processes with different specifications (e.g., different dopants, dopant concentrations, energy levels, etc.) to achieve the different conductivity types, conductivity levels, and different depths etc. Techniques for performing masked dopant implant processes to form in substrate wells (i.e., dopant implant regions) are well known in the art. Additionally, techniques for forming STI regions, SBL layers, LOCOS regions, gate structures, etc. and any of the other individual components of above-described semiconductor structures 100A-100E, 200A-200E, 300A-300E. Thus, such techniques have been omitted from this specification in order to allow the reader to focus on the salient aspects of the disclosed structure embodiments including, but not limited to: the symmetric structure of the BDSCR 150A-150E, 250A-250E, 350A-350E; the specific configurations of the wells in the side sections 151-152, 251-252, 351-352 and the middle section 153, 253, 353; optional differences in placement of the third well relative to the second well in each side section; optional differences in placement of contact regions relative to the second and third wells within each side section; optional differences in the placement and type of isolation structure above the fourth wells and the fifth well of the middle section; and the optional presence of gate structures.

It should be understood that in the structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate with a first type conductivity; and
   a device on the substrate and comprising:

a first well within the substrate and having a second type conductivity; and
within the first well, side sections and a middle section positioned laterally between the side sections, wherein each side section comprises:
  a second well with the first type conductivity; and
  a third well immediately adjacent to the second well and having the first type conductivity at a higher conductivity level than the second well, and
wherein the middle section comprises:
  two fourth wells having the second type conductivity at a higher conductivity level than the first well; and
  a fifth well positioned laterally between the fourth wells and having the first type conductivity.

2. The structure of claim 1,
wherein first type conductivity is P-type conductivity, and
wherein the second type conductivity is N-type conductivity.

3. The structure of claim 1,
wherein the substrate has a first surface and a second surface opposite the first surface,
wherein the first well extends to a first depth below the second surface,
wherein the second well extends to a second depth that is less than the first depth,
wherein the third well is within the second well and extends to a third depth that is less than the second depth, and
wherein each side section further comprises:
  a first contact region at the second surface adjacent to the second well, offset from the third well, and having the first type conductivity at a higher conductivity level than the second well; and
  a second contact region at the second surface adjacent to the third well and having the second type conductivity at a higher conductivity level than the fourth wells.

4. The structure of claim 3,
wherein the fourth wells extend to the third depth,
wherein the fifth well extends to the second depth, and
wherein the fourth wells and the fifth well are narrower in width than each third well and each second well.

5. The structure of claim 3, further comprising:
shallow trench isolation regions at the second surface between the first contact region and the second contact region in each side section and further extending laterally between the side sections over the fourth wells and the fifth well of the middle section; and
dielectric layers on the second surface above the side sections, wherein each dielectric layer extends laterally onto an edge of a shallow trench isolation region extending laterally between the side sections.

6. The structure of claim 3, further comprising: shallow trench isolation regions between the first contact region and the second contact region in each side section.

7. The structure of claim 6, further comprising: a dielectric layer on the second surface extending over the side sections and further over the middle section.

8. The structure of claim 6, further comprising:
dielectric layers on the second surface above the side sections; and
one of the following:
  a local oxidation of silicon region on the second surface above the middle section and extending between the dielectric layers;
  additional shallow trench isolation regions above the fourth wells and fifth well in the middle section and gate structures on the second surface above spaces between the fourth wells and the third well of each side section; and
  a single gate structure extending across the middle section extending between the dielectric layers.

9. A structure comprising:
a semiconductor substrate with a first type conductivity; and
a device on the substrate and comprising:
  a first well within the substrate and having a second type conductivity; and
  within the first well, side sections and a middle section positioned laterally between the side sections, wherein each side section comprises:
    a second well with the first type conductivity; and
    a third well having the first type conductivity at a higher conductivity level than the second well, wherein the third well is partially within the second well at an interface between the second well and the first well, and
  wherein the middle section comprises:
    two fourth wells having the second type conductivity at a higher conductivity level than the first well; and
    a fifth well positioned laterally between the fourth wells and having the first type conductivity.

10. The structure of claim 9,
wherein first type conductivity is P-type conductivity, and
wherein the second type conductivity is N-type conductivity.

11. The structure of claim 9,
wherein the substrate has a first surface and a second surface opposite the first surface, and
wherein each side section further comprises:
  a first contact region at the second surface adjacent to the second well, offset from the third well, and having the first type conductivity at a higher conductivity level than the second well; and
  a second contact region at the second surface adjacent to the third well and having the second type conductivity at a higher conductivity level than the fourth wells.

12. The structure of claim 11,
wherein the first well extends to a first depth below the second surface,
wherein the second well extends to a second depth that is less than the first depth,
wherein the third well extends to a third depth that is less than the second depth, and
wherein the fourth wells extend to the third depth,
wherein the fifth well extends to the second depth, and
wherein the fourth wells and the fifth well are narrower in width than each third well and each second well.

13. The structure of claim 11, further comprising:
shallow trench isolation regions at the second surface between the first contact region and the second contact region in each side section and further extending laterally between the side sections over the fourth wells and the fifth well of the middle section; and
dielectric layers on the second surface above the side sections, wherein each dielectric layer extends laterally onto an edge of a shallow trench isolation region extending laterally between the side sections.

14. The structure of claim 11, further comprising: shallow trench isolation regions between the first contact region and the second contact region in each side section.

15. The structure of claim 14, further comprising: a dielectric layer on the second surface extending over the side sections and further over the middle section.

16. The structure of claim 14, further comprising:
dielectric layers on the second surface above the side sections; and
one of the following:
   a local oxidation of silicon region on the second surface above the middle section and extending between the dielectric layers;
   additional shallow trench isolation regions above the fourth wells and fifth well in the middle section and gate structures on the second surface above spaces between the fourth wells and the third well of each side section; and
   a single gate structure extending across the middle section between the dielectric layers.

17. A structure comprising:
a semiconductor substrate with a first type conductivity, wherein the substrate has a first surface and a second surface opposite the first surface; and
a device on the substrate and comprising:
   a first well within the substrate and having a second type conductivity; and
   within the first well, side sections and a middle section positioned laterally between the side sections,
   wherein each side section comprises:
      a second well with the first type conductivity;
      a third well having the first type conductivity at a higher conductivity level than the second well, wherein the third well is partially within the second well at an interface between the second well and the first well;
      a first contact region at the second surface adjacent to the third well and having the first type conductivity at a higher conductivity level than the second well; and
      a second contact region at the second surface adjacent to the third well and having the second type conductivity, and
   wherein the middle section comprises:
      two fourth wells having the second type conductivity at a higher conductivity level than the first well; and
      a fifth well positioned laterally between the fourth wells and having the first type conductivity, wherein the fourth wells and the fifth well are all floating wells.

18. The structure of claim 17,
wherein the first well extends to a first depth below the second surface,
wherein the second well extends to a second depth that is less than the first depth,
wherein the third well extends to a third depth that is less than the second depth,
wherein the fourth wells extend to the third depth,
wherein the fifth well extends to the second depth, and
wherein the fourth wells and the fifth well are narrower in width than each third well and each second well.

19. The structure of claim 17, further comprising:
shallow trench isolation regions at the second surface between the first contact region and the second contact region in each side section and further extending laterally between the side sections over the fourth wells and the fifth well of the middle section; and
dielectric layers on the second surface above the side sections, wherein each dielectric layer extends laterally onto an edge of a shallow trench isolation region extending laterally between the side sections.

20. The structure of claim 17, further comprising:
shallow trench isolation regions between the first contact region and the second contact region in each side section;
dielectric layers on the second surface above the side sections; and
one of the following:
   a local oxidation of silicon region on the second surface above the middle section and extending between the dielectric layers;
   additional shallow trench isolation regions above the fourth wells and fifth well in the middle section and gate structures on the second surface above spaces between the fourth wells and the third well of each side section; and
   a single gate structure extending across the middle section between the dielectric layers.

\* \* \* \* \*